(12) United States Patent
Ferrasse et al.

(10) Patent No.: US 10,760,156 B2
(45) Date of Patent: Sep. 1, 2020

(54) COPPER MANGANESE SPUTTERING TARGET

(71) Applicant: Honeywell International Inc., Morris Plains, NJ (US)

(72) Inventors: Stephane Ferrasse, Spokane, WA (US); Frank C. Alford, Spokane Valley, WA (US); Susan D. Strothers, Mead, WA (US); Ira G. Nolander, Spokane, WA (US); Michael R. Pinter, Spokane, WA (US); Patrick Underwood, Spokane, WA (US)

(73) Assignee: Honeywell International Inc., Morris Plains, NJ (US)

( * ) Notice: Subject to any disclaimer, the term of this patent is extended or adjusted under 35 U.S.C. 154(b) by 148 days.

(21) Appl. No.: 16/148,084

(22) Filed: Oct. 1, 2018

(65) Prior Publication Data
US 2019/0112702 A1    Apr. 18, 2019

Related U.S. Application Data

(60) Provisional application No. 62/571,956, filed on Oct. 13, 2017.

(51) Int. Cl.
*C22C 9/05*    (2006.01)
*C23C 14/34*    (2006.01)

(52) U.S. Cl.
CPC ............ *C23C 14/3414* (2013.01); *C22C 9/05* (2013.01); *C23C 14/3421* (2013.01)

(58) Field of Classification Search
CPC .. C23C 14/34; C23C 14/3414; C23C 14/3421
See application file for complete search history.

(56) References Cited

U.S. PATENT DOCUMENTS

| | | | |
|---|---|---|---|
| 5,709,957 | A | 1/1998 | Chiang et al. |
| 5,906,717 | A | 5/1999 | Hasegawa et al. |
| 6,165,607 | A | 12/2000 | Yamanobe et al. |
| 6,329,275 | B1 | 12/2001 | Ishigami et al. |
| 6,569,270 | B2 | 5/2003 | Segal |

(Continued)

FOREIGN PATENT DOCUMENTS

| | | |
|---|---|---|
| CN | 102517621 B | 6/2012 |
| CN | 104746020 B | 7/2015 |

(Continued)

OTHER PUBLICATIONS

International Search Report and Written Opinion issued in PCT/US2018/055418, dated Jan. 31, 2019, 13 pages.

(Continued)

*Primary Examiner* — Rip A Lee
(74) *Attorney, Agent, or Firm* — Faegre Drinker Biddle & Reath LLP

(57) ABSTRACT

A method of forming a high strength copper alloy. The method comprises heating a copper material including from about 2 wt. % to about 20 wt. % manganese by weight of the copper material to a temperature above 400° C., allowing the copper material to cool to a temperature from about 325° C. to about 350° C. to form a cooled copper material, and extruding the cooled copper material with equal channel angular extrusion to form a cooled copper manganese alloy.

22 Claims, 8 Drawing Sheets

(56) References Cited

U.S. PATENT DOCUMENTS

| | | |
|---|---|---|
| 6,736,947 B1 | 5/2004 | Watanabe et al. |
| 7,256,980 B2 | 8/2007 | Borland |
| 7,260,053 B2 | 8/2007 | Harigaya et al. |
| 7,384,678 B2 | 6/2008 | Miura et al. |
| 7,413,977 B2 | 8/2008 | Shimizu et al. |
| 7,452,812 B2 | 11/2008 | Beyer et al. |
| 7,507,304 B2 | 3/2009 | Okabe et al. |
| 7,507,659 B2 | 3/2009 | Ohtsuka et al. |
| 7,611,984 B2 | 11/2009 | Koura et al. |
| 7,622,809 B2 | 11/2009 | Gotoh et al. |
| 7,626,665 B2 | 12/2009 | Koike |
| 7,719,626 B2 | 5/2010 | Takahashi et al. |
| 7,740,721 B2 | 6/2010 | Okabe |
| 7,767,043 B2 * | 8/2010 | Segal ................ C23C 14/3414 148/528 |
| 7,932,176 B2 | 4/2011 | Gordon et al. |
| 7,994,055 B2 | 8/2011 | Sakai et al. |
| 8,003,518 B2 | 8/2011 | Haneda et al. |
| 8,039,390 B2 | 10/2011 | Nakao et al. |
| 8,071,474 B2 | 12/2011 | Shimizu et al. |
| 8,110,504 B2 | 2/2012 | Nakao et al. |
| 8,119,462 B2 | 2/2012 | Takasawa et al. |
| 8,143,093 B2 | 3/2012 | Ye |
| 8,168,532 B2 | 5/2012 | Haneda et al. |
| 8,188,599 B2 | 5/2012 | Koike |
| 8,198,730 B2 | 6/2012 | Tagami et al. |
| 8,227,347 B2 | 7/2012 | Tatsumi |
| 8,242,015 B2 | 8/2012 | Matsumoto et al. |
| 8,247,321 B2 | 8/2012 | Matsumoto et al. |
| 8,258,626 B2 | 9/2012 | Koike et al. |
| 8,268,433 B2 | 9/2012 | Tsuchino et al. |
| 8,304,909 B2 | 11/2012 | Lavoie |
| 8,324,738 B2 | 12/2012 | Liu et al. |
| 8,410,581 B2 | 4/2013 | Tatsumi et al. |
| 8,500,928 B2 | 8/2013 | Matera et al. |
| RE44,817 E | 3/2014 | Koike |
| 9,028,658 B2 * | 5/2015 | Aoki .................. C23C 14/16 204/298.12 |
| 9,050,647 B2 | 6/2015 | Thomas et al. |
| 9,090,970 B2 * | 7/2015 | Nagata ..................... C22C 9/05 |
| 9,097,515 B2 | 8/2015 | Lim et al. |
| 9,165,750 B2 * | 10/2015 | Nagata ............... C23C 14/3407 |
| 9,704,695 B2 * | 7/2017 | Nagata ............... H01J 37/3435 |
| 2004/0104110 A1 | 6/2004 | Lee |
| 2005/0040030 A1 | 2/2005 | McDonald |
| 2005/0252584 A1 | 11/2005 | Watanabe et al. |
| 2005/0279630 A1 | 12/2005 | Fonte |
| 2006/0071338 A1 | 4/2006 | Petrarca et al. |
| 2006/0189132 A1 | 8/2006 | Iwabuchi et al. |
| 2006/0249372 A1 | 11/2006 | Xiang et al. |
| 2007/0137831 A1 | 6/2007 | Torng et al. |
| 2008/0105926 A1 | 5/2008 | Lai et al. |
| 2008/0121516 A1 | 5/2008 | Sarkar et al. |
| 2008/0131735 A1 | 6/2008 | Das et al. |
| 2008/0156636 A1 | 7/2008 | Petrarca et al. |
| 2008/0230375 A1 | 9/2008 | Maekawa et al. |
| 2008/0305573 A1 | 12/2008 | Sterzel |
| 2009/0020192 A1 | 1/2009 | Segal et al. |
| 2009/0022982 A1 | 1/2009 | Ivanov et al. |
| 2009/0065354 A1 | 3/2009 | Kardokus et al. |
| 2009/0117731 A1 | 5/2009 | Yu et al. |
| 2009/0184322 A1 | 7/2009 | Takasawa et al. |
| 2009/0242385 A1 | 10/2009 | Robison et al. |
| 2009/0321934 A1 | 12/2009 | Lavoie et al. |
| 2009/0321935 A1 | 12/2009 | O'Brien et al. |
| 2010/0007023 A1 | 1/2010 | Koura et al. |
| 2010/0013096 A1 * | 1/2010 | Irumata ............... C23C 14/3414 257/741 |
| 2010/0099254 A1 | 4/2010 | Narushima et al. |
| 2010/0233876 A1 | 9/2010 | Matsumoto et al. |
| 2011/0266676 A1 | 11/2011 | Isobayashi |
| 2011/0281134 A1 | 11/2011 | Maki et al. |
| 2011/0281136 A1 | 11/2011 | Duh et al. |
| 2012/0012465 A1 | 1/2012 | Kim et al. |
| 2012/0025380 A1 | 2/2012 | Neishi et al. |
| 2012/0068265 A1 | 3/2012 | Maki et al. |
| 2012/0132523 A1 | 5/2012 | Hagihara et al. |
| 2013/0001069 A1 | 1/2013 | Nakashima et al. |
| 2013/0069234 A1 | 3/2013 | Lee et al. |
| 2013/0126345 A1 | 5/2013 | Tatsumi et al. |
| 2013/0285245 A1 | 10/2013 | Cabral, Jr. et al. |
| 2014/0158532 A1 * | 6/2014 | Nagata ................ C23C 14/3414 204/298.13 |
| 2016/0130685 A1 | 5/2016 | Huang et al. |
| 2019/0112702 A1 * | 4/2019 | Ferrasse ................ C22C 9/05 |
| 2019/0233935 A1 * | 8/2019 | Ferrasse .................. B21J 1/003 |

FOREIGN PATENT DOCUMENTS

| | | | |
|---|---|---|---|
| CN | 104937133 A | 9/2015 | |
| CN | 105525149 A | 4/2016 | |
| CN | 105525262 A | 4/2016 | |
| CN | 106282938 A | 1/2017 | |
| CN | 106399954 A * | 2/2017 | ............... C22F 1/08 |
| CN | 106435261 A * | 2/2017 | ............... C22C 1/04 |
| EP | 0352748 B1 | 1/1990 | |
| EP | 0881311 A1 | 12/1998 | |
| EP | 1695839 A1 | 8/2006 | |
| JP | 2000348383 A | 12/2000 | |
| JP | 4718664 32 | 12/2001 | |
| JP | 4900992 32 | 2/2002 | |
| JP | 4900993 32 | 3/2002 | |
| JP | 2002141201 A | 5/2002 | |
| JP | 4936613 32 | 3/2003 | |
| JP | 4305809 32 | 2/2004 | |
| JP | 2004076080 A | 3/2004 | |
| JP | 3994386 B2 | 7/2004 | |
| JP | 4237479 B2 | 7/2004 | |
| JP | 4534417 32 | 7/2004 | |
| JP | 4379602 32 | 4/2005 | |
| JP | 4351036 B2 | 6/2005 | |
| JP | 2005313230 A | 11/2005 | |
| JP | 2006005104 A | 1/2006 | |
| JP | 5068925 32 | 3/2006 | |
| JP | 2006073863 A | 3/2006 | |
| JP | 4953615 32 | 6/2006 | |
| JP | 2006306043 A | 12/2008 | |
| JP | 2009266985 A | 11/2009 | |
| JP | 5277808 B2 | 3/2010 | |
| JP | 2011029255 A | 2/2011 | |
| JP | 2011214039 A | 10/2011 | |
| JP | 2011256457 A | 12/2011 | |
| JP | 2012149294 A | 8/2012 | |
| JP | 2012149346 A | 8/2012 | |
| JP | 2012156545 A | 8/2012 | |
| JP | 2013067857 A | 4/2013 | |
| JP | 5032706 B2 | 9/2013 | |
| KR | 10-0207185 B1 | 10/2011 | |
| KR | 1070185 B1 | 10/2011 | |
| KR | 2012001121 A | 1/2012 | |
| KR | 10-2013-0122968 A | 11/2013 | |
| KR | 2015039219 A | 4/2015 | |
| KR | 10-2015-0119284 A | 10/2015 | |
| KR | 2015119284 A | 10/2015 | |
| KR | 2017058459 A | 5/2017 | |
| WO | WO9961679 A1 | 12/1999 | |
| WO | WO 2014/002747 A2 * | 3/2014 | ............. C23C 14/34 |
| WO | WO 2015/099119 A1 * | 7/2015 | ............. C23C 14/34 |
| WO | 2017014990 A1 | 1/2017 | |

OTHER PUBLICATIONS

Jozef, Z.; et al. (2010). Ultrafine grained structure development in steel with different initial structure by severe plastic deformation. Revista Materia, 15(2):240-246.

Song, Y. B.; et al. (2006). Recrystallization behavior of 7175 Al alloy during modified strain-induced melt-activated (SIMA) process. Materials Transactions, 47(4):1250-1256.

Wang, P.; et al. (2015). A two-step superplastic forging forming of semi-continuously cast AZ70 magnesium alloy. Journal of Magnesium and Alloys 3:70-75.

(56) References Cited

OTHER PUBLICATIONS

International Search Report and Written Opinion received for PCT Patent Application No. PCT/US2019/016044, dated May 16, 2019, 8 pages.

* cited by examiner

COPPER MANGANESE SPUTTERING TARGET

CROSS-REFERENCE TO RELATED APPLICATION

This application claims priority to Provisional Application No. 62/571,956 filed Oct. 13, 2017, which is herein incorporated by reference in its entirety.

TECHNICAL FIELD

The present disclosure relates to high-strength copper manganese alloys. More specifically, the present disclosure relates to copper manganese alloys containing at least 2% by weight manganese. In some embodiments, the copper manganese alloys may be used in sputtering target assemblies. Methods of forming high-strength copper manganese alloys are also described.

BACKGROUND

Physical vapor deposition ("PVD") methodologies are used extensively for forming thin films of material over a variety of substrates. In one PVD process, known as sputtering, atoms are ejected from the surface of a sputtering target by bombardment with gas ions, such as plasma. Thus, the sputtering target is the source of material which is deposited onto a substrate.

A diagrammatic view of a portion of an exemplary sputtering assembly is shown in FIG. 1. A sputtering assembly 10 comprises a backing plate 12 having a sputtering target 14 bonded thereto. A semiconductor wafer 18 is positioned within the assembly and is spaced from a sputtering surface 16 of the sputtering target 14. In operation, particles or sputtered material 22 is displaced from the surface 16 of the sputtering target 14 and deposits on the surface of the semiconductor wafer 18 to form a coating (or thin film) 20 on the wafer. It is to be understood that the sputtering assembly 10 depicted in FIG. 1 is an example configuration since, for example, both the target 14 and the backing plate 12 can be any suitable size or shape. In some embodiments, the physical vapor deposition apparatus 10 may include the sputtering target 14 without the backing plate 12. This configuration is referred to as a monolithic configuration.

Various metals and alloys can be deposited using PVD technology, including for example Al, Ti, Cu, Ta, Ni, Mo, Au, Ag, Pt, and alloys of these elements. One such alloy is copper manganese ("CuMn") which has been used in sputtering targets to form, for example, various metal interconnects used in the semiconductor industry. Current CuMn alloy sputtering targets contain less than 1 wt % Mn.

Additionally, advances in semiconductor wafer fabrication technology have led to a demand for larger sputtering target configurations, such as 300 mm and 450 mm sputtering targets (i.e. targets for use in 300 mm or 450 mm silicon wafer deposit processes). High sputtering power is also being used to improve throughput, film quality, and uniformity. However, high sputtering power may increase the risk for deflection and warping in conventional sputtering targets. Therefore, there is a desire in the semiconductor industry for a sputtering target with a higher strength to limit deflection.

SUMMARY

In one embodiment, a method of forming a high strength copper alloy includes heating a copper material including manganese to a temperature above 400° C., wherein the copper material comprises from about 2 wt. % to about 20 wt. % manganese; allowing the copper material to cool to a temperature from about 325° C. to about 350° C. to form a cooled copper material; and extruding the cooled copper material with equal channel angular extrusion (ECAE) to form a cooled copper manganese alloy.

In another embodiment, a sputtering assembly includes a sputtering target having a copper alloy with copper as a primary component and also containing manganese, wherein the manganese is present at a weight percentage from about 2 wt. % to about 20 wt. % by weight of the copper alloy. The sputtering target has substantially refined secondary phases such that the secondary phases have a mean diameter that is approximately at least 1.5 times smaller than a mean diameter obtained by conventional thermo-mechanical processing methods, such as forging and rolling.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

DETAILED DESCRIPTION

Figure 1:
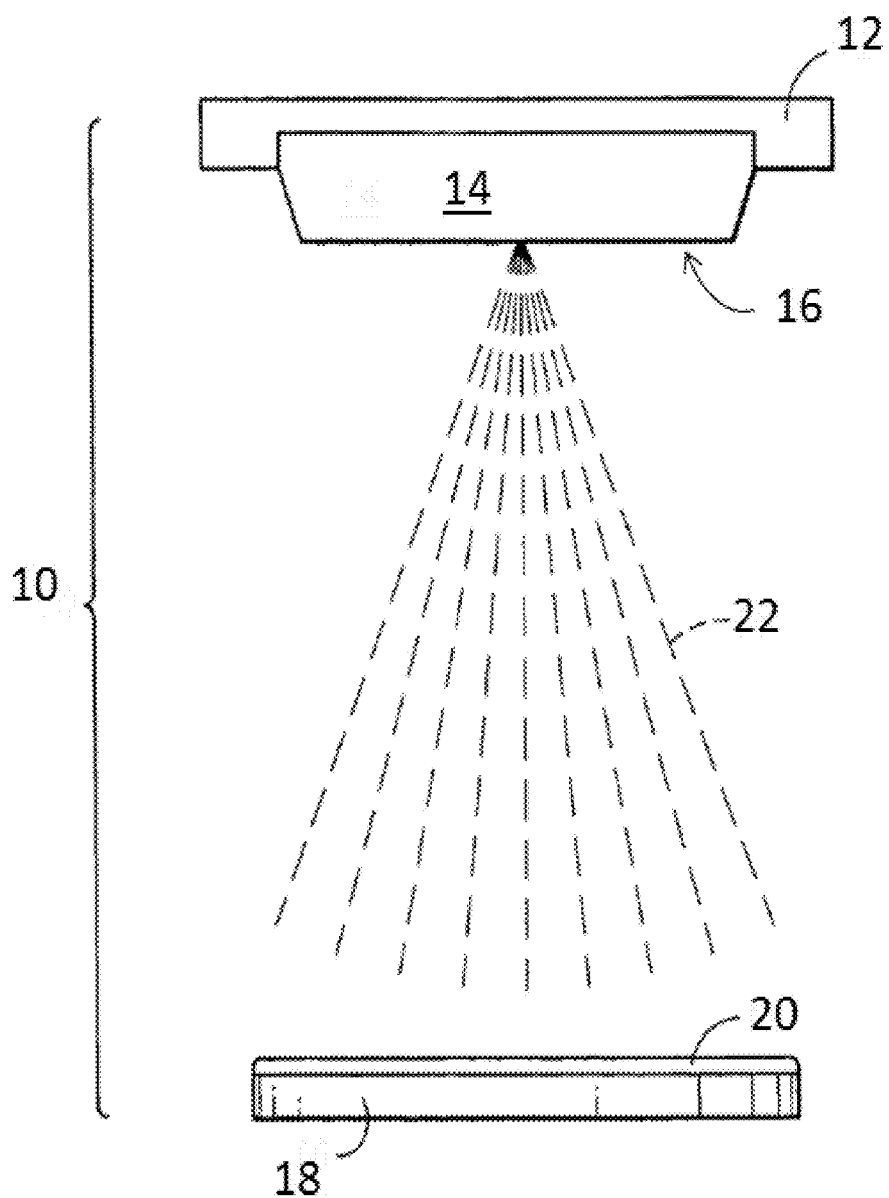
FIG. 1 is a diagrammatic view of a portion of a physical vapor deposition apparatus.

Disclosed herein is a high-strength copper manganese alloy for use, for example, in a sputtering target. More particularly, disclosed herein is a copper manganese alloy that has high-strength, high-thermal stability, and refined microstructures. Methods of forming a copper manganese alloy including heat treatment steps and equal channel angular extrusion (ECAE) are also disclosed.

The high-strength copper manganese alloy includes copper as a primary component and manganese as a minor component. Copper as the primary component is present in a higher weight percentage than manganese, which is a minor component. For example, the high-strength copper manganese alloy can include from about 80 wt. % to about 98 wt. %, from about 88 wt. % to about 97 wt. % or from about 90 wt. % to 92 wt. % copper, and from about 2 wt. % to about 20 wt. %, about 3 wt. % to about 12 wt. %, or about 8 wt. % to about 10 wt. % manganese. In some embodiments the high-strength copper manganese alloy may include copper, manganese and one or more additional minor components. In other embodiments, the high-strength copper manganese alloy may consist of copper, manganese and inevitable impurities, such as oxygen, carbon and other trace elements.

The high-strength copper manganese alloy has a refined microstructure. In some embodiments, the alloy has an average grain size of up to about 15 µm in diameter, such as from about 0.2 µm to about 15 µm. For example, the grain size may be from about 0.2 µm to about 1 µm, from about 1 µm to about 2.5 µm, from about 2.5 µm to about 6.5 µm, from about 6.5 µm to about 12.5 µm, or from about 12.5 µm to about 15 µm.

The copper manganese alloy may be substantially free of voids, such that fewer voids occur in the copper manganese alloy of the present disclosure as compared to an "as cast" material. In some embodiments, the alloy may be free of voids such that no voids occur. In other embodiments, the alloy may be substantially free of large porosities or holes, such as those larger than about 100 µm in diameter.

The copper manganese alloy may also have refined secondary phases. Copper alloys with a high (i.e., 2 wt. % or greater) weight percentage of manganese may contain manganese precipitate and secondary phases or inclusions, which are not desirable in sputtering targets. The secondary phases may include, for example, manganese oxides (MnO) and/or manganese sulfides (MnS), the formation of which depending on whether oxygen and/or sulfur is present during the alloying process. The current copper manganese alloy contains a limited amount of secondary phases, and the secondary phases present have a smaller mean diameter than the diameter of secondary phases present in alloys processed with conventional thermo-mechanical processing methods. For example, the secondary phases of the current copper manganese alloy may have a mean diameter that is at least about 1.5 times smaller than the mean diameter of alloys processed with conventional methods. Examples of conventional thermo-mechanical processing methods, or otherwise referred to herein as conventional methods, include as-cast and forging and rolling. Therefore, a copper manganese alloy processed with the current processing method may have secondary phases with at least about 1.5 times smaller mean diameter than copper manganese alloys processed with conventional methods.

The copper manganese alloy may also have increased hardness properties. In some embodiments, the Brinell Hardness (HB or HBN) of the copper manganese alloy may be from about 155 HB to about 200 HB.

The copper manganese alloy may also have high strength. Copper alloys with a high (i.e., 2 wt. % or greater) weight percentage of manganese typically have higher strength than copper alloys with a low (i.e., less than 2 wt. %) weight percentage of manganese. For example, the copper manganese alloy may have an average yield strength from about 475 MPa to about 700 MPa.

In some embodiments, the copper manganese alloy may be a sputtering target for use in a physical vapor deposition apparatus, such as apparatus 10 shown in FIG. 1. In some embodiments, the copper manganese alloy sputtering target may be connected or bonded to a backing plate. In other embodiments, the copper manganese alloy may be a monolithic target.

Figure 2:
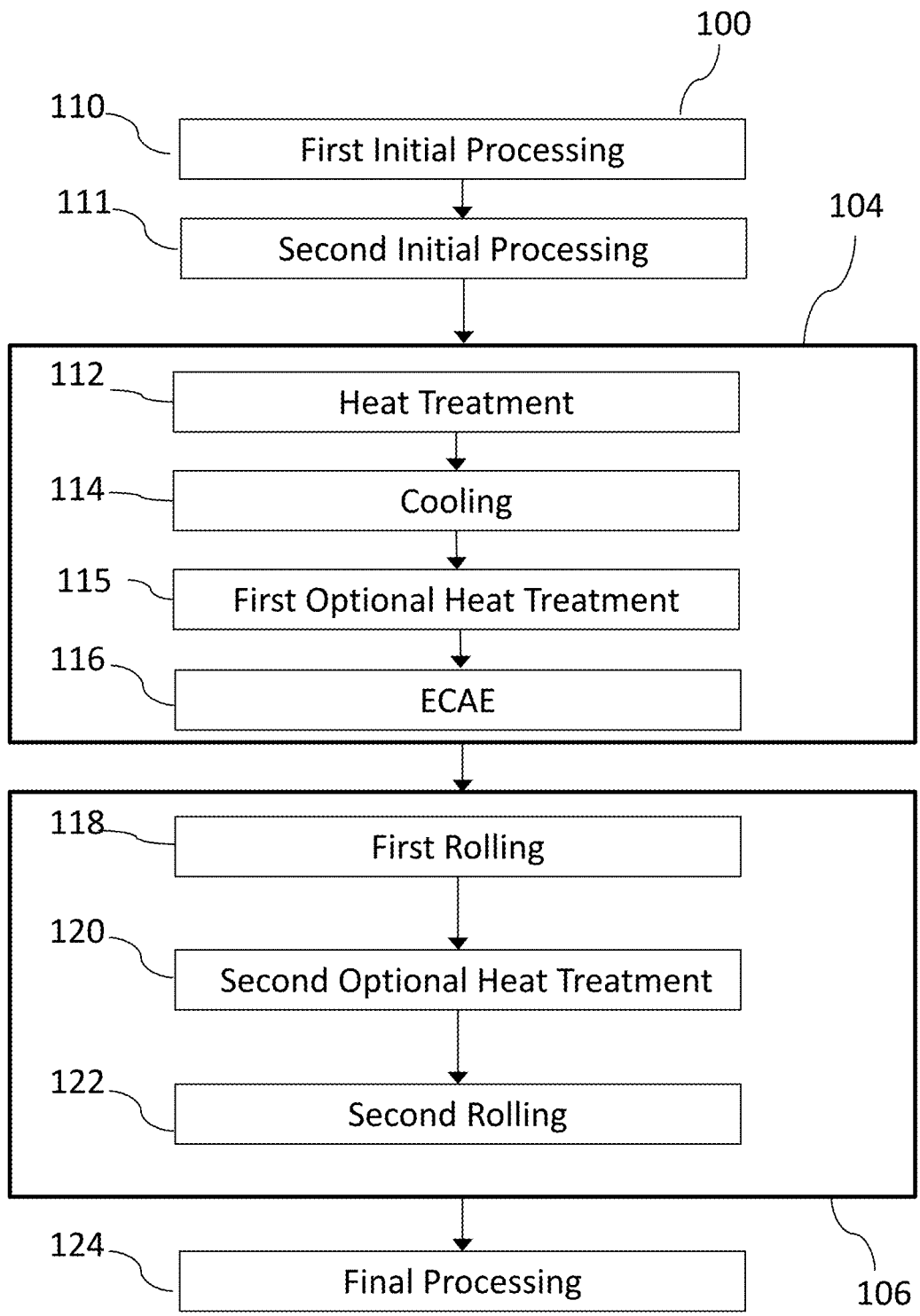
FIG. 2 is a flow diagram of a method of forming a copper manganese alloy according to some embodiments.

The copper manganese alloy sputtering target 14 may be formed by a method according to FIG. 2. FIG. 2 is a flow diagram of a method 100 of forming a copper manganese alloy according to some embodiments. In one embodiment, the method 100 includes a first initial processing step 110. The first initial processing step 110 may include, for example, the addition of alloying elements (i.e. manganese) by using powders, chips, flakes, cast master alloys, or granulates to achieve a preferred material composition. The first initial processing step 110 may also include other processes known to one of ordinary skill in the art such as casting. In some embodiments, the method 100 also includes a second initial processing step 111 involving initial thermo-mechanical (TMP) processing. One exemplary TMP processing method includes hot forging of the copper manganese material. During hot forging, height of the copper manganese billet is reduced so that billet size is adequate for further processing. Hot forging may also further refine as-cast grain size and increase homogenization or composition and reduction of as-cast defects such as voids and porosities. Hot forging temperature depends on the weight percentage of manganese. For example, in alloys with a lower weight percentage of manganese, a suitable hot forge temperature range may be from about 400 to 600° C. for a period of at least 1 hour. In alloys with a higher weight percentage of manganese, a suitable temperature range may be from about 600 to about 950° C. for a period of at least 1 hour. After hot forging, the copper material may be water quenched or cooled in air to room temperature. The second initial processing step 111 may also include other processes known to one of ordinary skill in the art.

The method 100 further includes a first processing sequence 104 comprising step 112, step 114, and step 116. In step 112, the copper material is heated to a temperature above 400° C. for a period of at least 1 hour. For example, the copper material may be heated to a temperature from about 425° C. to about 450° C. for a period of at least 1 hour. However, this temperature may vary depending on the weight percentage of manganese present in the CuMn alloy. For example, the temperature may be higher for CuMn alloys with high weight percentages of manganese to achieve better healing of porosities and to homogenize composition. This temperature can be determined by measuring the Brinell Hardness. For example, the Brinell hardness should be between about 90 and 130 after heat treatment in order to limit cracking and reduce loading during subsequent ECAE processing. In some embodiments, the temperature may be about 10° C. lower than the full recrystallization temperature of a copper manganese alloy that has undergone 3-4 passes of ECAE. The full recrystallization temperature may be determined by heat treating the copper material for 1 hour at various temperatures and measuring grain size and Brinell hardness. Full recrystallization is complete when all grains have recrystallized. The copper material is a mixture of copper and manganese wherein copper is present as a primary component and manganese as a minor component. For example, copper may be present in an amount from about 80 wt. % to about 98 wt. % copper and from about 2 wt. % to about 20 wt. % manganese. The copper material may also contain other minor components or impurities. In some embodiments, step 112 may be done by homogenization or annealing to provide uniform microstructures.

In step 114, the copper material is cooled to a temperature from about 300° C. to about 350° C. to form a cooled copper material. For example, the copper material may be cooled to a temperature from about 325° C. to about 350° C. The copper material may be cooled rapidly, such as by quenching, or may be air cooled at an ambient temperature.

In step 115, the cooled copper material may undergo a first optional heat treatment step. For example, the cooled copper material may be heated to a temperature from about 425° C. to about 750° C. for a period of at least 1 hour. This optional heat treatment may be completed to recrystallize any deformities in the microstructure resulting from the annealing step 112 and/or the cooling step 114, and may result in a more uniform and refined microstructure.

In step 116, the cooled copper material is extruded with ECAE to form an ECAE copper manganese alloy. In some embodiments, step 116 includes from 1 to 4 passes of ECAE. In other embodiments, step 116 may comprise 4 or more passes of ECAE. In some embodiments, the copper manages alloy may be rotated between ECAE passes. For example, step 116 may comprise 4 passes of ECAE, during which the cooled copper material is rotated 90 degrees between each pass.

The method 100 may further include a final processing step 124 which may include, for example, multi-step heat treatments, stress relieving, or any other process which does not affect the properties of the copper manganese alloy. The alloy can then be subject to further processing to be used as a monolithic target or may be bonded to a backing plate to be used in sputtering applications.

In another embodiment, the method 100 may include an initial processing step 110 as disclosed above, a first processing step 104 as disclosed above, and an optional second processing sequence 106 comprising step 118, step 120, and step 122.

In step 118, the cooled copper manganese alloy is subjected to a first rolling step.

In step 120, the alloy may undergo a second optional heat treatment step wherein the alloy is heated to a temperature above 400° C. for a period of at least 0.5 hours to form a heated copper manganese alloy. For example, in one embodiment, the cooled copper manganese alloy may be heated to a temperature from about 400° C. to about 575° C. for a period of about 0.5 hours to about 4 hours. In another example, the alloy may be heated to a temperature from about 425° C. to about 550° C. depending upon desired properties of the alloy such as strength, grain size, and any other properties.

In step 122, the heated copper manganese alloy may undergo a second rolling step or, alternatively, a forging, extrusion, or drawing step to form a hardened copper manganese alloy. In some embodiments, this hardened copper manganese alloy has a substantially refined microstructure such that the grain structure is substantially uniform and equiaxed. Additionally, in some embodiments, the hardened copper manganese alloy may have a mean grain size from about 1.5 μm to about 15 μm. In other embodiments, the alloy may have a mean grain size from about 1.5 μm to about 5 μm. The method 100 may further include a final processing step 124 as disclosed above.

CuMn alloys having a higher percentage of manganese often exhibit increased strength and/or hardness properties as compared to CuMn alloys having a lower percentage of manganese. However, because CuMn alloys having a higher percentage of manganese are harder and have a higher tendency to form porosities and cast defects, there is often a higher tendency for cracks due to the brittle nature of the material. The ECAE process described herein results in a manufacturable CuMn alloy.

EXAMPLE 1

Effect of Anneal Temperature and Mn Content on Hardness

The effect of annealing (i.e. heat treatment) temperature on hardness for various copper manganese alloys having weight percentages between about 0.5 wt. % Mn to about 10 wt. % Mn was observed. The copper manganese alloys were heated to temperatures from about 250° C. to about 600° C. and the corresponding Brinell Hardness (HB) values were determined by performing a standard Brinell Hardness test according to U.S. Standard ASTM E10-14.

Figure 3:
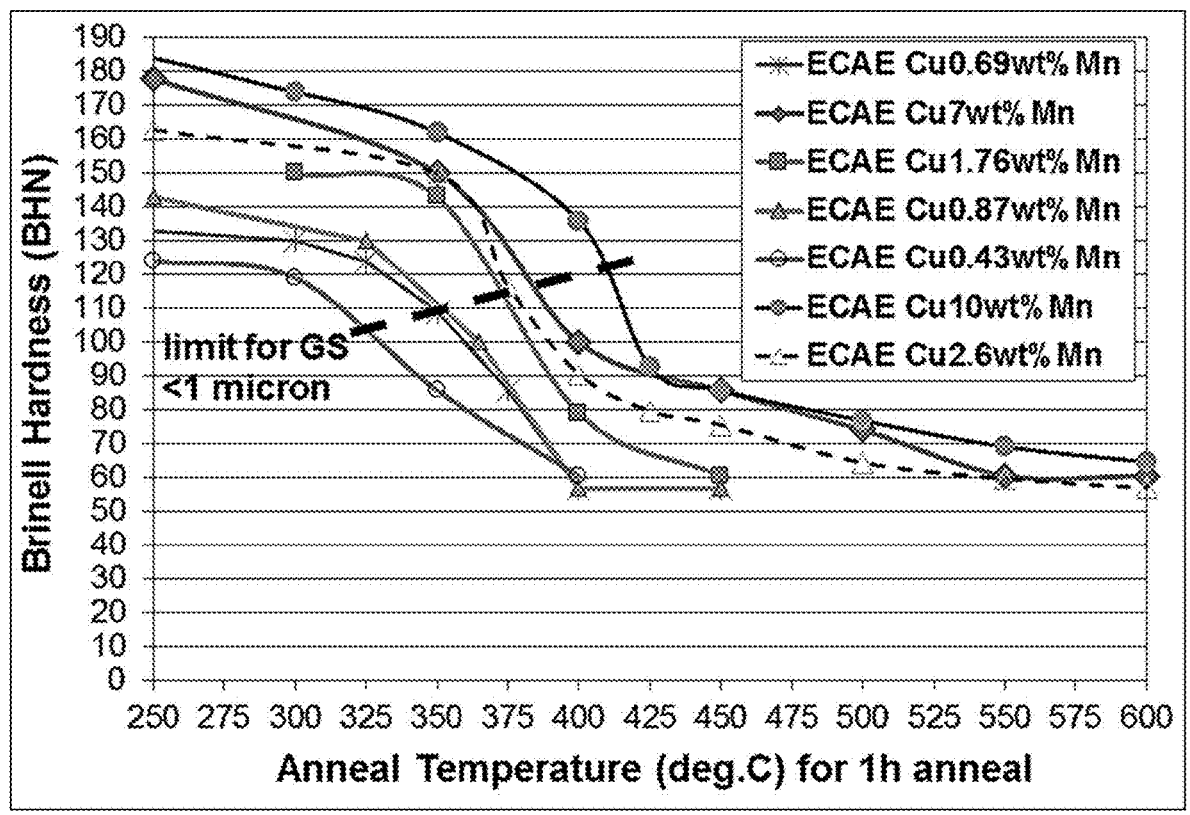
FIG. 3 is a graph comparing Brinell Hardness and anneal temperature for certain example copper alloys.

FIG. 3 shows the relationship between HB values and anneal temperature for seven different copper manganese alloy compositions which were formed by combining high-purity copper with manganese in the amount listed in Table 1. For all CuMn alloys used in this example, 6N Cu (99.9999% purity) and 5N Mn (99.999% purity) were used. All alloys were processed with ECAE. All numbers in Table 1 are expressed on a weight percent basis.

TABLE 1

| Composition | Weight Percent Mn |
| --- | --- |
| 1 | 0.69 |
| 2 | 7 |
| 3 | 1.76 |
| 4 | 0.87 |
| 5 | 0.43 |
| 6 | 10 |
| 7 | 2.6 |

As shown in FIG. 3, Composition 2 and Composition 6 having a weight percentage of Mn of 7 wt. % and 10 wt. %, respectively, have higher HB values than the copper manganese alloys with lower weight percentages of Mn regardless of anneal temperature. For example, at 425° C., both Composition 2 and Composition 6 have an HB value of approximately 90, while Composition 3 and Composition 4 with lower weight percentages of Mn have an HB value of only around 60. Composition 7, having a weight percentage of Mn of 2.6 wt. %, offers higher HB values than copper manganese alloys with lower weight percentages.

The relationship with grain size is also shown in FIG. 3. In this example, grain size is measured for each sample by measuring the average size of multiple individual grains according to U.S. Standard ASTM E 112. The limit for obtaining a grain size of less than 1 μm is illustrated by the dashed line, with points above the dashed line having a grain size less than 1 μm and points below the dashed line having a grain size of 1 μm or greater. Thus, the dashed line represents the hardness limit (i.e. the minimum hardness that can be obtained for each alloy) for a grain size of less than 1 μm at a specific annealing temperature. For example, Composition 2 and Composition 6 require a higher anneal temperature to reach the same grain size than compositions with lower weight percentages of Mn. However, Composition 2 and Composition 6 also have a higher HB value at the same grain size than compositions with lower weight percentages of Mn. For example, Composition 6 had an HB value of approximately 120 at a grain size of less than 1 μm, while, at the same grain size, Compositions 1, 3, 4, and 5 only had an HB value between about 100 and 110. FIG. 3 also shows that the maximum attainable hardness for CuMn alloys with a high weight percentage of manganese and grain size of less than 1 μm is increased. For example, at 250° C., Compositions 2 and 6 having HB values in the range of 180-190, whereas Compositions 1, 3, 4, and 5 have HB values below 150.

EXAMPLE 2

Effect of Anneal Temperature and Processing Methods

The effect of annealing temperature was observed for three different processing methods. The control process included a standard forge and roll (forge+roll) process with no ECAE. This control process was compared to 1) a four-pass ECAE and roll (ECAE+roll) process and 2) a four-pass ECAE (ECAE) process with no rolling. Annealing was completed after the standard forge+roll, ECAE+roll, and ECAE steps, respectively. A copper manganese alloy having about 10 wt. % Mn was used for all processes. Results are shown in FIG. 4.

Figure 4:
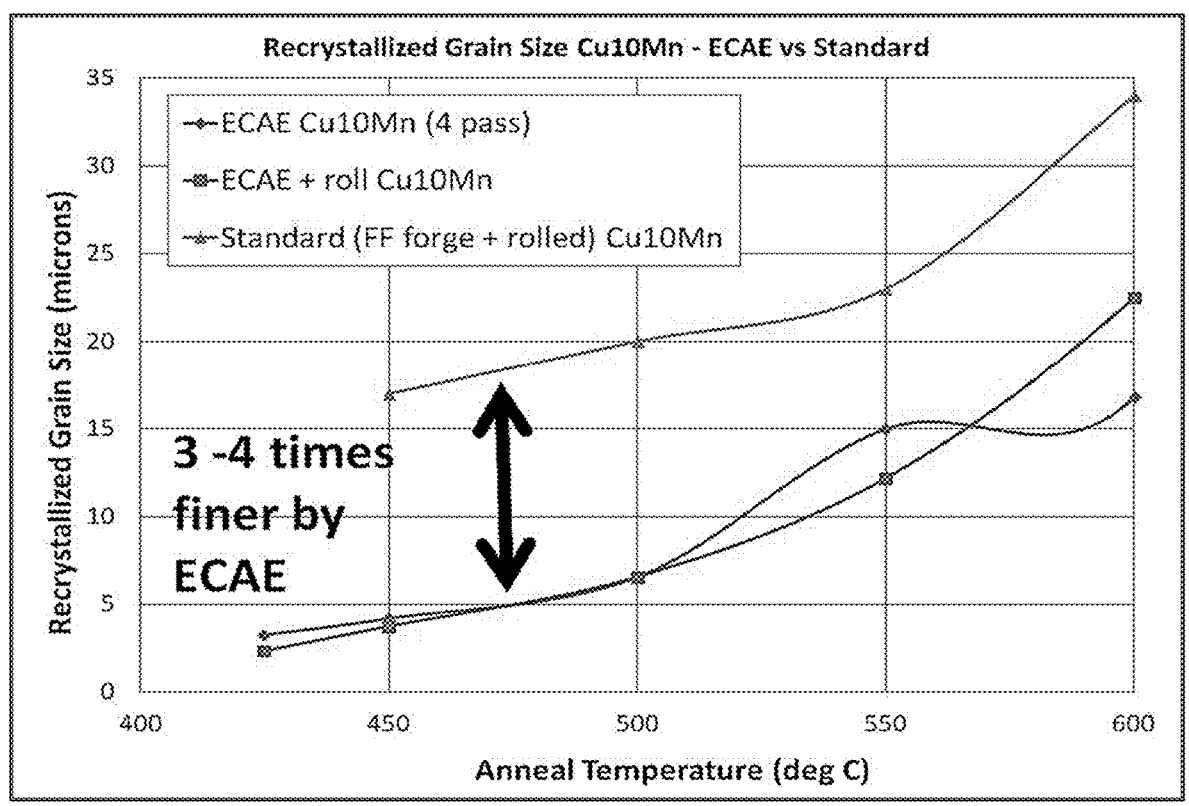
FIG. 4 is a graph comparing recrystallized grain size to anneal temperature for certain example processing methods.

FIG. 4 shows that both the ECAE+roll process and the ECAE process resulted in a finer crystal structure and smaller recrystallized grain size than the forge+roll process at all tested anneal temperatures. On average, FIG. 4 shows that the forge+roll process had 3-4 times larger grain size than each of the processes involving ECAE. For example, when annealed at 500° C., the forge+roll process had an average grain size of approximately 20 µm compared to an average grain size of approximately 7 µm for both the ECAE+roll process and the ECAE process.

EXAMPLE 3

Effect of Anneal Temperature on Recrystallized Grain Size

The effect of annealing temperature on grain size was observed for a copper manganese alloy processed with ECAE. A copper manganese alloy having 10 wt. % manganese was annealed to various temperatures after processing with four-passes of ECAE. After annealing, the grain sizes of the alloy samples were compared using an optical microscope.

Figure 5A:
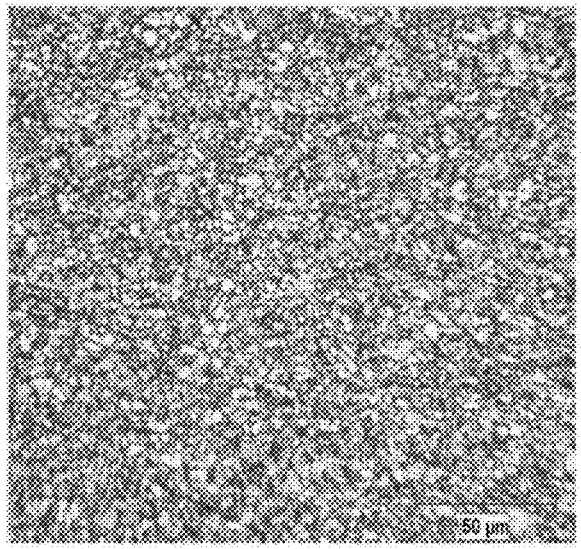
FIGS. 5A, 5B, 5C, and 5D are micrographs comparing grain sizes of a copper manganese alloy subjected to certain processing conditions taken with an optical microscope.
Figure 5B:
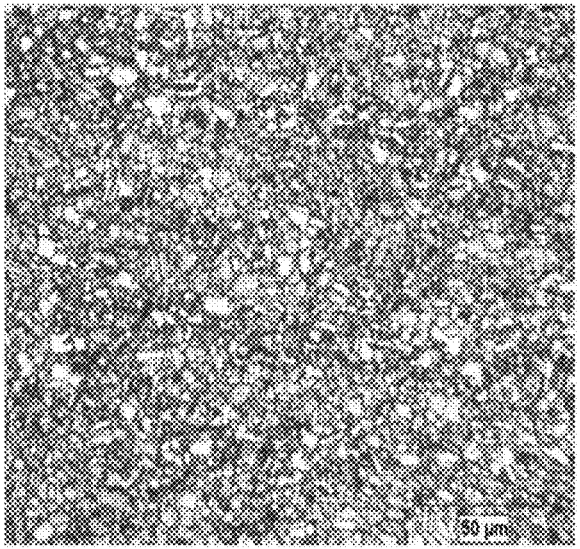
Figure 5C:
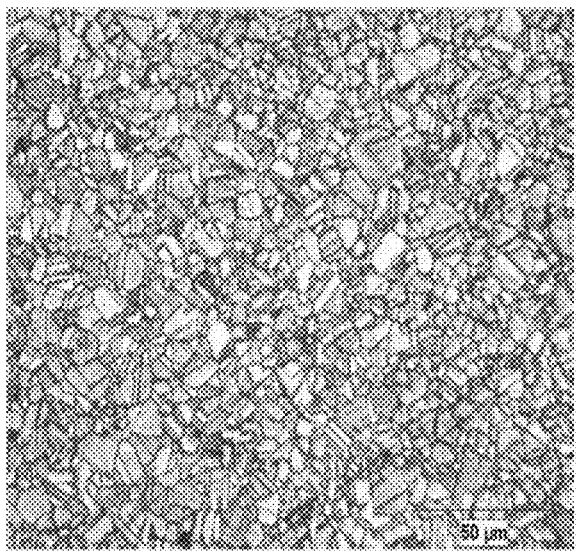
Figure 5D:
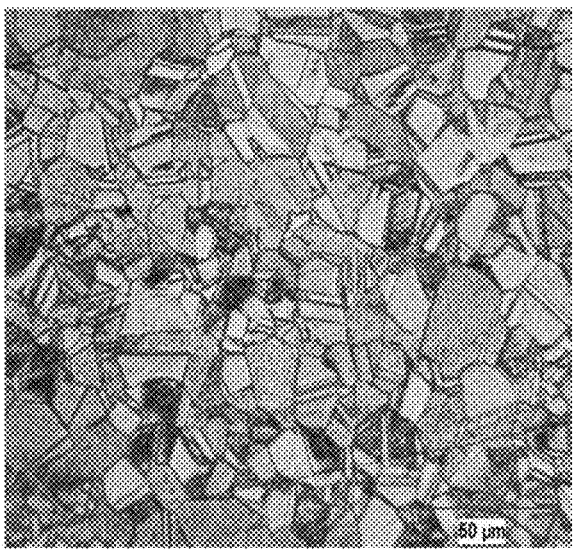

FIGS. 5A, 5B, 5C, and 5D show resultant grain sizes. In FIG. 5A, the sample was annealed to a temperature of about 425° C. As shown, the average grain size was from about 1.8 µm to about 2.3 µm. In FIG. 5B, the sample was annealed to a temperature of about 450° C., resulting in an average grain size of about 3.75 µm. In FIG. 5C, the sample was annealed to a temperature of about 500° C., resulting in an average grain size of about 6.5 µm. In FIG. 5D, the sample was annealed to about 550° C., resulting in an average grain size of about 12.1 µm. Therefore, in this example, annealing at lower temperatures (i.e. between about 425° C. and about 450° C.) resulted in a more refined crystal structure with smaller average grain sizes, while annealing at higher temperatures (i.e. between about 500° C. and about 550° C.) resulted in significantly larger average grain sizes. Annealing at temperatures below 425° C. resulted in a submicron grain size.

EXAMPLE 4

Effect of Processing Method on Strength

The effect of processing method on strength was observed for two copper alloys. The Cu10Mn alloy was formed by combining copper with 10 wt. % manganese. This Cu10Mn alloy was processed via 1) standard forge and roll, 2) ECAE, and 3) ECAE with roll (ECAE+roll). The copper alloy C18000 (a copper-based alloy containing chromium, nickel and silicon) was also tested. Cu C18000 is one alloy currently used for backing plates of sputtering targets. The Cu C18000 material was tested 1) "as received" (i.e. without additional processing) and 2) after a hot isostatic pressing (HIPing) process in which high temperature and high pressure was applied to the material. Yield strength and ultimate tensile strength were determined for all samples by performing a standard tensile test according to the ASTM E8 standard. A round tension test specimen with a 5.08 cm (2-inch) gage length and 1.27 cm (0.5-inch) diameter was cut from each material and tested at room temperature per the standard procedure referenced above.

Figure 6:
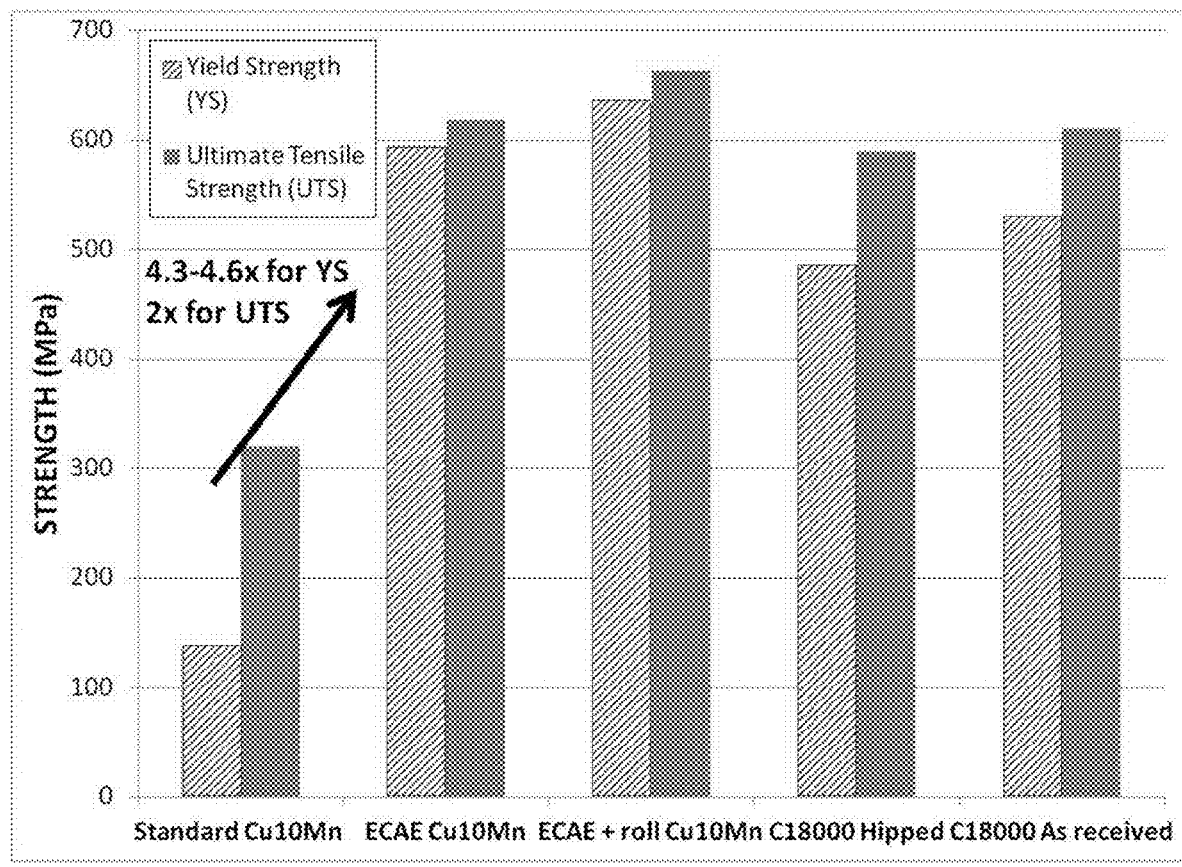
FIG. 6 is a graph comparing yield strength and ultimate tensile strength for a copper manganese alloy subjected to certain example processing methods.

FIG. 6 compares the yield strength and ultimate tensile strength for each processing method as noted above. Results for the Cu10Mn alloy show a greater yield strength and ultimate tensile strength for the ECAE and the ECAE+roll processes. For example, the ECAE and ECAE+roll samples had yield strengths of approximately 600 MPa and 630 MPa, respectively, about 4.5 times higher than the standard forge and roll process, which had a yield strength of about 150 MPa. Similarly, the ECAE and the ECAE+roll processes had ultimate tensile strengths of approximately 620 MPa and 650 MPa, respectively, which were about two times higher than the standard forge and roll process with an ultimate tensile strength of about 320 MPa.

FIG. 6 also compares the Cu10Mn alloy to the C18000 material. Results show that the Cu10Mn alloy, when processed with either ECAE or ECAE+roll, has a higher yield strength and ultimate tensile strength than the C18000 material both when tested both "as received" and after HIPing.

Also of note, the resulting average grain size of the CuMn alloy after both the ECAE and ECAE+roll processes was less than 1 µm. This is due to the ECAE contributing to a more refined microstructure. The average grain size of the CuMn alloy after standard forge+roll was approximately 30 µm.

EXAMPLE 5

Effect of Composition on Yield Strength

The effect of composition on yield strength was observed for various copper manganese alloy compositions and various other backing plate materials. The materials tested are shown below in Table 2.

TABLE 2

| Sample Number | CuMn Alloy | Backing Plate Materials |
|---|---|---|
| 1 | Cu10Mn | — |
| 2 | Cu0.43Mn | — |
| 3 | Cu0.69Mn | — |
| 4 | Cu0.87Mn | — |
| 5 | Cu10Mn | — |
| 6 | — | Al 6061 T4 |
| 7 | — | Al 6061 T6 |
| 8 | — | CuCr |
| 9 | — | High Strength Al |
| 10 | — | C18000 |

Sample 1 contains about 10 wt. % Mn and was processed by standard forge and roll. Samples 2-4 comprise an amount of manganese commonly used in sputtering applications. Samples 2-4 contain approximately 0.43 wt. %, 0.69 wt. %, and 0.87 wt. % Mn, respectively. Sample 5 also contains about 10 wt. % Mn. Each of Samples 2-5 were processed with four-passes of ECAE. Between each pass of ECAE, Samples 2-4 were heated to temperatures from about 325° C. to about 350° C. Sample 5 was subject to a heat treatment process between ECAE pass. This process included heat treating to a temperature between about 400-450° C. for at least 30 min., air cooling at ambient temperature until a temperature of about 350° C. is reached, and heat treating to a temperature between about 325-350° C. for at least 30 min. This process was done to limit loads and provide a better surface quality of the sample. Samples 6-10 include various backing plate materials commonly used in sputtering applications.

Figure 7:
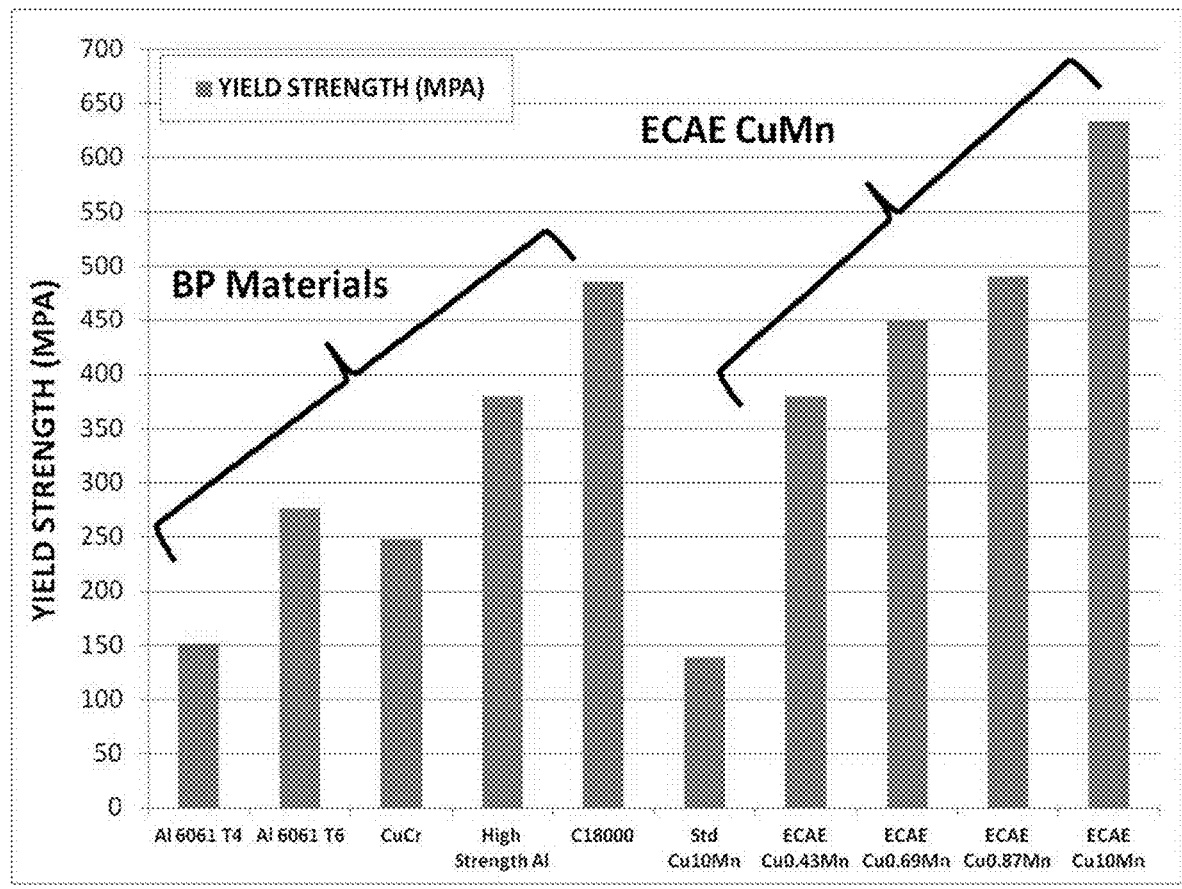
FIG. 7 is a graph comparing the yield strength of some existing backing plate materials to the yield strength of certain example copper manganese alloys.

FIG. 7 compares the yield strength of the above materials. As shown, all materials processed with ECAE (i.e. Samples 2-5) resulted in, on average, higher yield strengths than materials not processed with ECAE. Sample 5 (ECAE Cu10Mn) showed the highest yield strength of all samples tested and was more than four times higher than the yield strength of Sample 1. For example, Sample 5 had a yield strength of about 640 MPa while Sample 1 had a yield strength of only about 140 MPa. Sample 5 also had a higher yield strength than all of Samples 6-10.

EXAMPLE 6

Effect of Composition on Brinell Hardness

The effect of composition on Brinell Hardness (HB) was observed for various copper manganese alloy compositions and various other backing plate materials. The materials tested are shown below in Table 3.

TABLE 3

| Sample Number | CuMn Alloy | Backing Plate Materials |
|---|---|---|
| 1 | Cu0.43Mn | — |
| 2 | Cu0.43Mn | — |
| 3 | Cu0.87Mn | — |
| 4 | Cu1.7Mn | — |
| 5 | Cu7Mn | — |
| 6 | Cu10Mn | — |
| 7 | — | Al 6061 T4 |
| 8 | — | Al 6061 T6 |
| 9 | — | CuCr |
| 10 | — | High Strength Al |
| 11 | — | C18000 |

Samples 1-4 contain approximately 0.43 wt. %, 0.43 wt. %, 0.87 wt. %, and 1.7 wt. % Mn, respectively. Samples 5-6 contain about 7 wt. % and 10 wt. % Mn, respectively. Sample 1 was processed by standard forge and roll, which resulted in a grain size of about 35 µm. Samples 2-6 were processed with ECAE, resulting in a grain size of less than 1 µm. Samples 7-11 include various backing plate materials commonly used in sputtering applications.

Figure 8:
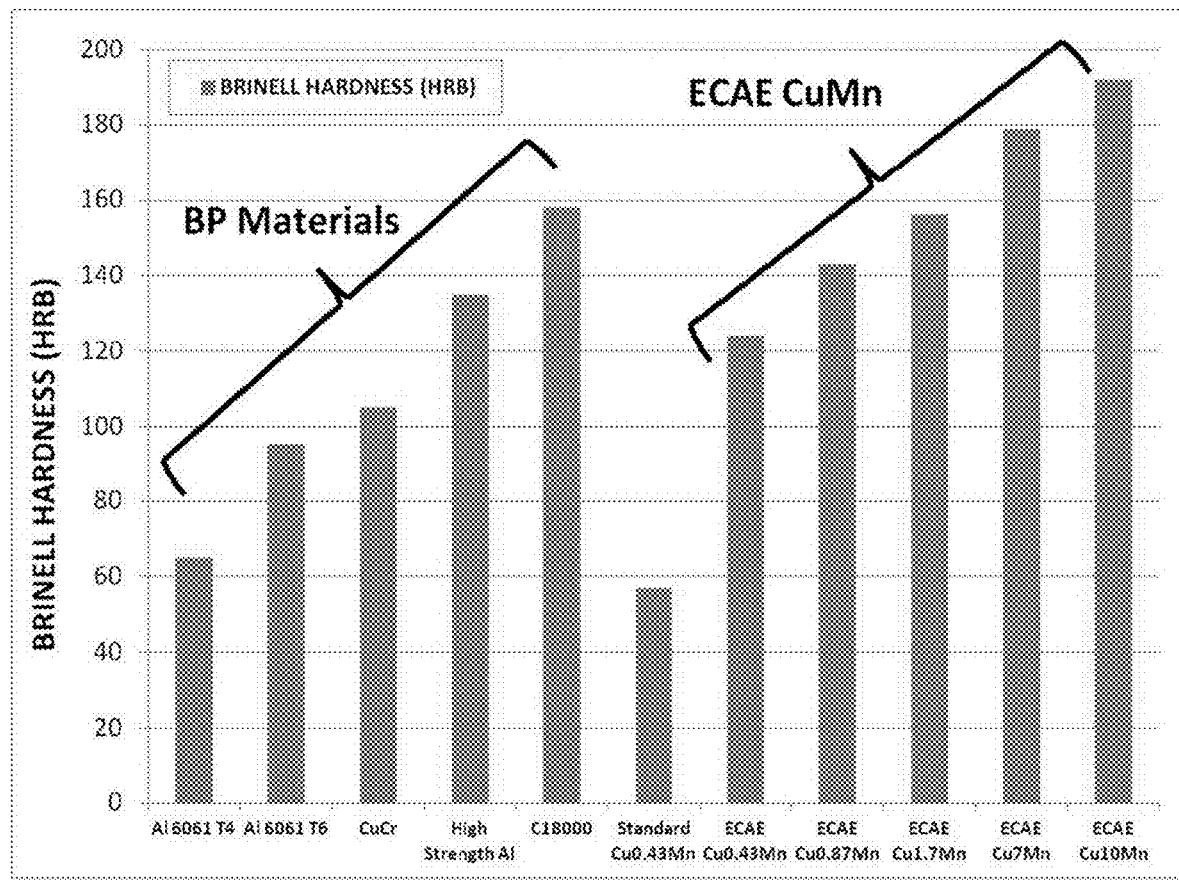
FIG. 8 is a graph comparing the Brinell Hardness of some existing backing plate materials to the Brinell Hardness of certain example copper manganese alloys.

FIG. 8 compares the Brinell Hardness (HB) of the above materials. Again, most materials processed with ECAE (Samples 2-5) resulted in higher HB than materials not processed with ECAE, with the exception of Sample 10 (High Strength Aluminum) and Sample 11 (C18000). However, Samples 5-6 having a weight percentage of 7 wt. % and 10 wt. %, respectively, had a higher HB than all other materials tested. For example, Sample 5 had an HB of about 180 and Sample 6 had an HB of about 190, while Sample 10 had an HB of about 130 and Sample 11 had an HB of about 160. Therefore, a weight percentage of manganese greater than about 2 wt. % (i.e. about 7 wt. % to about 10 wt. %) as well as processing with ECAE resulted in the highest Brinell Hardness.

EAMPLE 7

Effect of Processing Method on Secondary Phases

The effect of processing method on the size of secondary phases was observed. The secondary phases were detected by an automated procedure using integrated SEM/EDX and include manganese sulfate (MnS). The integrated SEM/EDX system used in this example is sold by FEI under the name Aspex Explorer and provides data reporting at magnifications up to ×50,000. The average diameter of secondary phases in a copper manganese alloy with about 10 wt. % manganese (Cu10Mn) were detected in "as cast" material, after forge and roll, and after ECAE and roll. Results are compared below in Table 4. All diameters are in microns

TABLE 4

| Process | Diameter of MnS |
|---|---|
| As Cast | 6.6 |
| Forge + Roll | 4.1 |
| ECAE + Roll | 2.4 |

The average area of secondary phases in Cu10Mn material was also detected in "as cast" material, after forge and roll, and after ECAE and roll. Results are compared below in Table 5. All area measurements are in square microns (µm²).

TABLE 5

| Process | Area of MnS |
|---|---|
| As Cast | 62 |
| Forge + Roll | 26 |
| ECAE + Roll | 9 |

As shown in Table 4 and Table 5 above, the Cu10Mn alloy subjected to ECAE showed smaller secondary phases as compared to both the "as cast" and the forge and roll materials. On average, the secondary phases in materials subjected to ECAE had about three times smaller diameter and seven times smaller area than secondary phases in the "as cast" material. Therefore, processing copper manganese alloys with ECAE resulted in more refined secondary phases (MnS) with smaller diameters and/or areas than not processing with ECAE.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above described features.

The following is claimed:

1. A method of forming a high strength copper manganese alloy, the method comprising:
   heating a copper material including manganese to a temperature above 400° C., the copper material comprising from about 2 wt % to about 20 wt % manganese;
   allowing the copper material to cool to a temperature from about 325° C. to about 350° C. to form a cooled copper material; and
   extruding the cooled copper material with equal channel angular extrusion (ECAE) to form a cooled copper manganese alloy.

2. The method of claim 1, wherein the copper material comprises from about 3 wt % to about 12 wt % manganese.

3. The method of claim 1, wherein the copper material comprises from about 8 wt % to about 10 wt % manganese.

4. The method of claim 1, wherein extruding the cooled copper material comprises at least 4 passes of equal channel angular extrusion.

5. The method of claim 1, wherein the high strength copper manganese alloy has a mean grain size up to about 15 μm in diameter.

6. The method of claim 1, wherein the high strength copper alloy has a mean grain size of less than about 1 μm in diameter.

7. The method of claim 1, wherein the high strength copper manganese alloy has a mean grain size up to about 2 μm in diameter after heating to a temperature from about 400° C. to about 450° C. for at least one hour.

8. The method of claim 1, wherein the high strength copper alloy has a mean grain size from about 12 μm in diameter to about 15 μm in diameter after heating to a temperature from about 500° C. to about 550° C. for at least one hour.

9. The method of claim 1, wherein the high strength copper manganese alloy has a mean yield strength of between about 475 MPa and about 700 MPa.

10. The method of claim 1, wherein the high strength copper manganese alloy has substantially refined secondary phases such that the secondary phases have a mean diameter that is at least about 1.5 times smaller than a mean diameter obtained by conventional thermo-mechanical processing methods.

11. The method of claim 1, the method further comprising:
subjecting the cooled copper manganese alloy to a first rolling step,
heating the cooled copper manganese alloy to a temperature from about 400° C. to about 575° C. for at least 0.5 hours to form a heated copper manganese alloy, and
subjecting the heated copper manganese alloy to a second rolling step to form a hardened copper manganese alloy.

12. The method of claim 11, wherein the hardened copper manganese alloy has a mean grain size from about 1.5 μm in diameter to about 15 μm in diameter.

13. A sputtering assembly comprising a sputtering target comprising:
a copper alloy with copper as a primary component and containing manganese, wherein the manganese is present at a weight percentage from about 2 wt % to about 20 wt % by weight of the copper alloy, and wherein the sputtering target has substantially refined secondary phases such that the secondary phases have a mean diameter that is at least about 1.5 times smaller than a mean diameter of an as-cast copper alloy.

14. The sputtering assembly of claim 13, wherein the copper alloy comprises from about 3 wt % to about 12 wt % manganese.

15. The sputtering assembly of claim 13, wherein the copper alloy comprises from about 8 wt % to about 10 wt % manganese.

16. The sputtering assembly of claim 13, wherein the copper alloy has a mean grain size of up to about 15 μm in diameter.

17. The method of claim 13, wherein the high strength copper alloy has a mean grain size of less than about 1 μm in diameter.

18. The sputtering assembly of claim 13, wherein the copper alloy has a mean grain size up to about 2 μm in diameter after heating to a temperature from about 400° C. to about 450° C. for at least one hour.

19. The sputtering assembly of claim 13, wherein the copper alloy has a mean grain size from about 12 μm in diameter to about 15 μm in diameter after heating to a temperature from about 500° C. to about 550° C. for at least one hour.

20. The sputtering assembly of claim 13, wherein the copper alloy has a mean yield strength of between about 475 MPa and about 700 MPa.

21. The sputtering assembly of claim 13, further comprising a backing plate connected to a back surface of the sputtering target.

22. The sputtering assembly of claim 20, wherein the backing plate is diffusion bonded to the back surface of the sputtering target.

* * * * *